United States Patent [19]

Robinson

[11] Patent Number: 4,593,339
[45] Date of Patent: Jun. 3, 1986

[54] ANTI-STATIC TRANSIT CASE

[76] Inventor: Will B. Robinson, 38 Bernard Avenue, Toronto, Ontario, Canada, M5R 1R2

[21] Appl. No.: 723,561

[22] Filed: Apr. 15, 1985

[30] Foreign Application Priority Data

May 7, 1984 [CA] Canada .................................. 453722

[51] Int. Cl.⁴ ........................ H05F 3/02; B65D 73/02
[52] U.S. Cl. .................................... 361/215; 361/220; 206/334
[58] Field of Search ............... 361/212, 215, 216, 220, 361/390, 394, 399, 413, 415, 417; 206/328, 329, 334

[56] References Cited

U.S. PATENT DOCUMENTS 4,439,809 3/1984 Weight et al. ...................... 361/220
4,446,966 5/1984 Moloney ............................. 206/334

Primary Examiner—L. T. Hix
Assistant Examiner—Douglas S. Lee
Attorney, Agent, or Firm—Bachman & LaPointe

[57] ABSTRACT

A carrying case for electrostatic sensitive circuit boards comprises a conductive outer shell having a lid thereto; and a conductive inner support for the circuit boards, and a switch circuit which electrically isolates the inner support from the shell when the lid of the container is closed, and which connects the inner support to the shell when the lid is opened.

17 Claims, 3 Drawing Figures ic sleeve 44 therearound.

ANTI-STATIC TRANSIT CASE

FIELD OF INVENTION

This invention relates to a container suitable for use in the transportation and storage of electrostatic sensitive circuit boards or the like.

BACKGROUND OF INVENTION

Circuit boards for electronic equipment commonly include thereon electrostatic sensitive devices. Such devices may well be damaged by static voltages of as little as 200 v., or about one order less than the static voltages that may be generated by persons in a relatively dry atmosphere. It is a preferred practice to enclose such circuit boards within a Faraday shield maintained at ground potential. However, it will be appreciated that where such circuit boards are in transit, particularly by common carrier, less than ideal handling conditions will be encountered, and a convenient grounding circuit may be available.

The circuit boards may also be subject to mechanical damage, particularly in the condition spoken of where they are transported by common carrier.

It is known to provide foam cushioning for the transporation of electrostatic sensitive devices. Generally speaking, foam cushioning may, under mechanical action, generate high static potentials. For this reason it is normally treated with an antistatic agent which reduces the surface resistivity of the material to below about $10^{14}$ ohms/sq., and which thus acts to limit the formation of electrostatic charges. Agents used to promote anti-static properties may be somewhat fugitive, and as a consequence they may not provide the desired protection against the generation of static charges.

SUMMARY OF THE INVENTION

In accordance with the present invention, a carrying case for electrostatic sensitive devices comprises a container having a conductive outer shell which will form a Faraday shield. The container further comprises a conductive support for the circuit boards located on the interior of the container and spaced apart from the outer shell by an insulating means. Preferably, the insulating means comprises an antistatic foam, which will additionally serve to provide a mechanical cushioning action. Circuit means is provided which may selectively connect the metallic outer shell to the conductive support, or disconnect same so as to conductively isolate the support from the outer shell. Expediently, the circuit means comprises a switch which may be automatically operated. Thus, in accordance with one aspect of the invention, the container comprises a lid, and as the lid is closed it serves to operate the switch to disconnect the conductive support from the outer shell, and conversely to connect the interior support to the outer shell as the lid is opened.

The conductive support may be expediently formed as a composite structure to include an underlaying metal wall, and mounted thereon guide members which are fashioned from a material which is readily moulded or otherwise more readily formed than metal, to provide a support for circuit board to be conductive. The non-metallic components may be rendered conductive by surface coating with graphite, for example. Where the materials are moulded plastic materials, these may be conveniently formulated to include conductive fillers therein such as carbon. In all events, the conductive support will have a surface which contacts the circuit board which has a surface resistivity of not greater than about $10^5$ ohms/sq.

In accordance with the illustrated embodiment, the conductive support is a composite sleeve structure comprising a generally continuous tubular metal wall which underlays a grooved plastic structure, the latter being coated with a graphite material, and sandwiched therebetween a stiffening layer of a cellulosic board, the whole being unified by conductive rivets. It is not found to be wholly necessary that the conductive support surround the circuit boards on all sides thereof, and in practise the sleeve surrounds four sides of the circuit boards, of which two sides are major surfaces.

The invention will be further described in relation to a presently preferred embodiment thereof, as illustrated in the accompanying drawings.

DESCRIPTION OF THE PREFERRED EMBODIMENT

Figure 1:
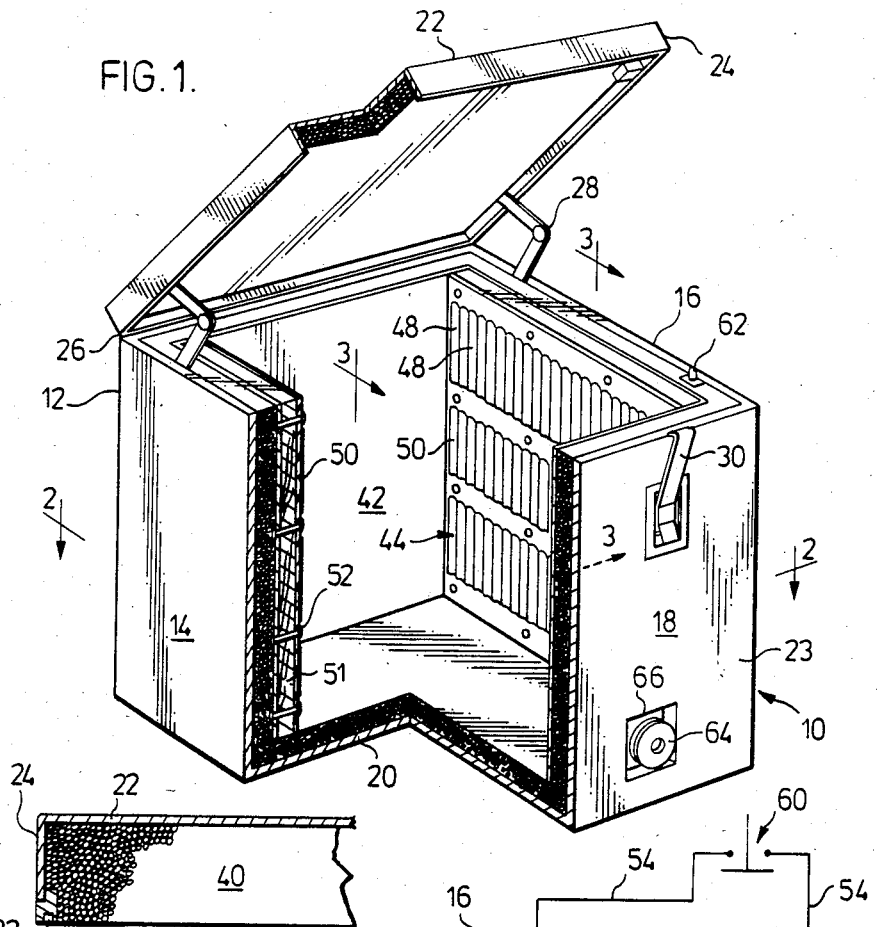
FIG. 1—is an isometric view of a container with the lid in the partially opened position, and cut away to reveal constructional detail.
Figure 3:
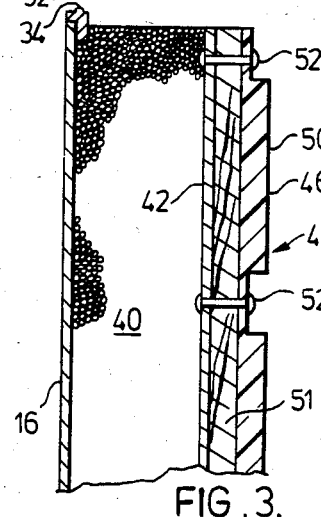
Figure 2:
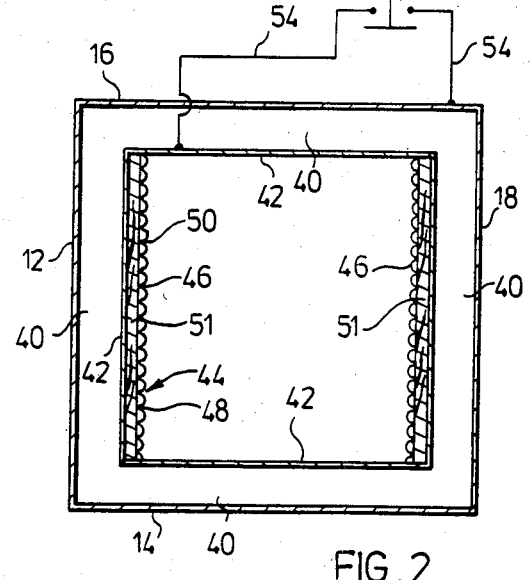
FIG. 2—is a section along 2—2 of FIG. 1, and further includes a schematic ilustration of the electrical circuit employed with the container, and FIG. 3—is a fragmentary view of enlarged scale along 3—3 of FIG. 1, with the lid approaching its closed position.

Referring to the drawings now in detail, a container constructed in accordance with the invention is represented generally therein by the numeral 10.

Container 10 comprises a rectangular prismatic structure including side walls 12, 14, 16 and 18 bottom wall 20 and top wall 22, which may be collectively referred to as shell walls 23; top wall 22 may be otherwise referred to as lid 22. Lid 22 has a downwardly turned margin 24. Shell walls 23 are formed of a conductive material, for which purpose sheet aluminum is convenient. Lid 22 is connected to side wall 12 by a metal hinge 26 to provide a conductive path therebetween, a further conductive path being formed by hinged elbows 28 which connect respectively between lid 22 and each side wall 14, 16, the elbows serving to retain lid 22 in its open position to provide access to the interior of container 10. Toggle latches 30 (only one of which is shown) locate on side wall 18 opposite to hinge 26 to latch lid 22 closed. The perimeter of lid margins 24 is provided with a compressible seal element 32 which is drawn tightly against a mating rib 34 provided about the upper perimeter of side walls 12, 14, 16 and 18 when lid 22 is latched closed, thereby generally sealing the interior of container 10 against the ingress of dust and water or the like.

The interior facing wall surface of shell 23 is lined with a plastic foam material 40, so as to be generally coextensive with the interior wall surface of the shell. Plastic foam 40 is an electrically insulating material, treated to be anti-static, and will normally have a surface resistivity of between about $10^9$ to $10^{14}$ ohms/sq. Such material is well known in the art and in commerce.

A sheet metal wall 42 is secured to the interior facing surface of the plastic foam layer 40 which overlays side walls 12, 14, 16 and 18 of the container, to form a generally continuous conductive sleeve 44 therearound.

Sleeve 44 further comprises a pair of generally identical guide members 46. Guide members 46 have a plurality of vertical grooves 48 formed therein to receive and locate the edge of circuit boards (not shown) to be transported and/or stored in container 10. Guide members 46 are expediently constructed from polystyrene, which is surface coated with graphite so as to have a conductive surface, which is to say a surface resistivity of not more than about $10^5$ ohms/sq. Both major surfaces of each guide member 46 may be so coated, although in practise it is only found necessary that the inwardly facing surface, that is the surface 50 contacting the circuit boards, be conductive. It should be understood that supports 46 may be constructed of materials that have a bulk resistivity of less than about $10^5$ ohms/cm. As a manufacturing expedient, both metal wall 42 and moulded guide members 46 are relatively lightly structured, and strength is given to the composite by an intermediate layer 51 of Masonite compressed cellulosic fibre material, the whole being mechanicaly unified by conducting rivets 52, which further provide a conductive path between wall 42 and conducting surface 50 of the guide members. Conveniently, plastic foam 40 may be adhered on the one side to shell 23 and on the other side to sleeve 44, to form a laminated structure. Circuit boards stored in container 10 will be then surrounded on each of their sides by the conductive outer shell 23, and by the foam layer 40, and on four sides, of which two sides will be major sides, by sleeve 44.

As thus far described, it will be appreciated that conducting shell walls 23 of container 10 will form a Faraday shield, and that sleeve 44 forms an equipotential surface electrically isolated from the Faraday shield. Should container 10 be exposed to relatively high voltage while in transit, whether these of elastrostatic or electrodynamic origin, they are unlikely to be transmitted to sleeve 44, and such voltage as may be transmitted thereto will not produce significant potential differences across any components contained on the circuit boards because of the conductive path provided by sleeve 44.

A conductive circuit is provided comprising conductor 54 which connects between sleeve 44 and shell 23 at side wall 16, and which is interrupted by switch 60. Switch 60 is biased to a normally closed position, thereby providing an electrical circuit which interconnects sleeve 44 to the outer walls of container 10. Switch 60 has a plunger 62 which locates in a position to be depressed by lid 22 as the lid moves towards its closed position, to thereby open the switch, and to so isolate sleeve 44 from the outer walls of container 10.

Assuming shell 23 to be grounded, it will be appreciated that as lid 22 is opened, any charge that may have been induced or otherwise reside on sleeve 44 will drain to the outer walls of container 10. Under ideal conditions the lid 22 of container 10 will be opened only when the container is grounded, preferaby by its being located on a grounded surface. However, it will be appreciated that container 10 may be required to be opened under less than ideal conditions. For this purpose a reel of grounding wire 64 is mounted in a recess 66 formed in side wall 18 of the container 10, so as to be accessible prior to opening lid 22, whereby it may be employed to ground the outer walls of the container prior to opening the container, and to so provide a discharge path for any charge that may be found on sleeve 44 and/or shell 23.

The foregoing embodiment is exemplary only of the invention. It will be appreciated that many changes therefrom may be made, and which in some circumstances may be desirable. All such changes as fall within the spirit of the claims appended hereto are intended to be covered by the invention.

I claim:

1. A container for the transportation of electrostatic sensitive circuit boards or the like comprising:
   an outer shell of electrically conductive material;
   a conductive support for at least partially surrounding circuit boards when located within said container, and spaced apart from said outer shell by insulating means so as to electrically isolate said conductive support from said outer shell, and
   switch means for selectively electrically connecting and disconnecting said outer shell to and from said conductive support.

2. A container as defined in claim 1, wherein said outer shell comprises a lid movable between an open position, in which access to the interior of said container is provided, and a closed position.

3. A container as defined in claim 2, wherein said switch means comprises a switch which is biased to a normally closed position, and which is urged towards an open position as said lid is closed.

4. A container as defined in claim 2, wherein said outer shell comprises seal means located about the peripheral margin of said lid which cooperate with other peripheral margins of said outer shell to provide a seal therebetween when said lid is closed.

5. A container as defined in claim 1, wherein said insulating means comprises an anti-static plastic foam layer which serves to cushion said conductive support.

6. A container as defined in claim 5, wherein said foam layer provides a substantially complete lining for the interior walls of said container.

7. A container as defined in claim 1, wherein said conductive support comprises a sleeve, which surrounds a circuit board when contained within said container on four sides thereof, two of such sides being major sides.

8. A container as defined in claim 7, wherein said conductive support includes a pair of opposed guide means adapted to locate the edges of said circuit boards.

9. A container as defined in claim 8, wherein said guide means are constructed from a normally non-conductive material treated or formulated to render it conductive.

10. A container as defined in claim 9, wherein said material is coated with graphite to render it conductive.

11. A container as defined in claim 1, including a grounding wire storable therein and accessible when said lid is closed, and electrically connected to said outer shell.

12. A container for the transit of electrically and mechanically sensitive circuit boards or the like comprising:
   an outer metal wall structure defining a rigid rectangular prismatic shell having a top wall, bottom wall and side walls extending therebetween;
   hinge means connecting between the top wall of said structure and a side wall thereof whereby said top wall is movable between open and closed positions;
   seal means to provide a seal between the perimeter of said top wall and said side walls when said top wall is in said closed position;

latch means for selectively retaining said top wall in its closed position and releasing same;

a layer of anti-static plastic foam material secured to the interior surface of said shell and substantially coextensive therewith;

an inner metal wall overlaying said foam layer on the sides thereof adjacent said top wall;

a pair of opposed facing non-metallic guide members having grooved wall structure to support and retain one or more circuit boards therebetween;

said non-metallic guide members being formulated or coated to be conductive and being secured to and conductively connected to said inner metal wall, and circuit means to selectively connect said outer shell and said inner metal wall.

13. A container as defined in claim 12, wherein there is interposed a rigidifying material between said guide members and said inner metal wall.

14. A container as defined in claim 12, wherein said seal means includes a resilient seal member.

15. A container as defined in claim 12, wherein said circuit means comprises a normally closed switch located so as to be urged to an open position when said top wall is in its closed position.

16. A container as defined in claim 13, wherein said non-metallic guide members are coated with a graphitic conducting material.

17. A container as defined in claim 12, further comprising a grounding wire connected to said shell and storable in a recess provided therein.

* * * * *